(12) United States Patent
Kim

(10) Patent No.: US 12,350,918 B2
(45) Date of Patent: *Jul. 8, 2025

(54) METHOD AND SYSTEMS FOR RECYCLING END-OF-LIFE PHOTOVOLTAIC MODULES

(71) Applicant: Taesung Kim, Lake Forest, IL (US)

(72) Inventor: Taesung Kim, Lake Forest, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/639,835

(22) Filed: Apr. 18, 2024

(65) Prior Publication Data

US 2024/0262097 A1     Aug. 8, 2024

Related U.S. Application Data

(63) Continuation of application No. 17/874,044, filed on Jul. 26, 2022, now Pat. No. 11,987,037, which is a
(Continued)

(51) Int. Cl.
*B32B 43/00*     (2006.01)
*B32B 38/10*     (2006.01)
(Continued)

(52) U.S. Cl.
CPC ............ *B32B 43/006* (2013.01); *B32B 38/10* (2013.01); *B65G 1/02* (2013.01); *H02S 99/00* (2013.01);
(Continued)

(58) Field of Classification Search
CPC ........ B32B 2310/0806; B32B 2457/12; B32B 43/006; B32B 38/10; B65G 1/02;
(Continued)

(56) References Cited

U.S. PATENT DOCUMENTS 6,940,008 B2     9/2005   Shiotsuka et al.
7,683,340 B2     3/2010   Friedman
(Continued)

FOREIGN PATENT DOCUMENTS

CN     110491969 A     11/2019
CN     111725353 A      9/2020
(Continued)

OTHER PUBLICATIONS

Translation JP 2003309086, Kai, Oct. 2003 (Year: 2003).*
(Continued)

*Primary Examiner* — Philip C Tucker
*Assistant Examiner* — Jimmy R Smith, Jr.
(74) *Attorney, Agent, or Firm* — Foley & Lardner LLP

(57) ABSTRACT

A method of decommissioning a solar module installation including a plurality of solar modules includes selecting a first solar module of the plurality of solar modules, the first solar module including a plurality of solar cells, a front layer, a back sheet, a first layer of encapsulant between the front layer and the plurality of solar cells, and a second layer of encapsulant between the back sheet and the plurality of solar cells. The method further includes applying X-ray radiation to the first solar module to debond at least one of the first layer of encapsulant or the second layer of encapsulant; and separating at least one of the front layer or the back sheet from the plurality of solar cells.

15 Claims, 3 Drawing Sheets

Related U.S. Application Data continuation of application No. 17/347,171, filed on Jun. 14, 2021, now Pat. No. 11,407,215.

(60) Provisional application No. 63/124,844, filed on Dec. 13, 2020.

(51) Int. Cl.
 *B65G 1/02* (2006.01)
 *H02S 99/00* (2014.01)

(52) U.S. Cl.
 CPC ... *B32B 2310/0806* (2013.01); *B32B 2457/12* (2013.01)

(58) Field of Classification Search
 CPC ....... H01L 31/048; H01L 31/18; H02S 99/00; H05K 2203/178
 See application file for complete search history.

(56) References Cited

U.S. PATENT DOCUMENTS

| | | | |
|---|---|---|---|
| 9,203,069 B2 | 12/2015 | Lee | |
| 11,987,037 B2* | 5/2024 | Kim | H01L 31/18 |
| 2003/0024635 A1* | 2/2003 | Utsunomiya | H10D 86/60 156/155 |
| 2018/0315884 A1 | 11/2018 | Schrijnemakers et al. | |
| 2019/0194506 A1* | 6/2019 | Gelorme | H01L 21/48 |
| 2019/0308405 A1 | 10/2019 | Gross | |
| 2021/0162729 A1 | 6/2021 | Sakai et al. | |

FOREIGN PATENT DOCUMENTS

| | | |
|---|---|---|
| JP | 2003309086 A * | 10/2003 |
| KR | 20180091446 A | 8/2018 |
| KR | 101986837 B1 | 6/2019 |
| KR | 102091346 B1 | 3/2020 |
| KR | 20200132236 A | 11/2020 |
| KR | 102561195 B1 | 7/2023 |

OTHER PUBLICATIONS

Berger, et al., "A novel approach for the recycling of thin film photovoltaic modules," Resources, Conservation and Recycling 54(10), pp. 711-718 (2010).
Berry, "Case study of a growth driver—silver use in solar," PV-Tech, retrieved from https://www.pv-tech.org/case_study_of_a_growth_driver_silver_use_in_solar/, 6 pages (2014).
Fraunhofer Ise, "Fraunhofer Institute for Solar Energy Systems Photovoltaics Report," 42 pages (2014).
Giacchetta, et al., "Evaluation of the environmental benefits of new high value process for the management of the end of life of thin film photovoltaic modules," Journal of Cleaner Production 51, pp. 214-224 (2013).
International Electrotechnical Commission, "Terrestrial photovoltaic (PV) modules—Design qualification and type approval—Part 1: Test requirements," IEC 61215-1:2016, 7 page preview provided (2016).
Irena & IEA-PVPS, "End-of-life management: Solar Photovoltaic Panels," International Renewable Energy Agency and International Energy Agency Photovoltaic Power Systems Programme, 100 pages (2016).
ITRPV, "International Technology Roadmap for Photovoltaic (ITRPV) 2013 Results," 37 pages (2014).
Kang, et al., "Experimental investigations for recycling of silicon and glass from waste photovoltaic modules," Renewable Energy 47, pp. 152-159 (2012).
Kim & Lee, "Dissolution of ethylene vinyl acetate in crystalline silicon PV modules using ultrasonic irradiation and organic solvent," Solar Energy Materials and Solar Cells 98, pp. 317-322 (2012).
Marwede & Reller, "Future recycling flows of tellurium from cadmium telluride photovoltaic waste," Resources, Conservation and Recycling 69, pp. 35-49 (2012) (22 page post-print version provided).
Novoa, "Adhesion and reliability of solar module materials," Stanford University, retrieved from https://stacks.stanford.edu/file/druid:td803kh9320/All-Chapters-v21-Esubmission-augmented.pdf, 118 pages (2015).
Wang, et al., "Recycling of materials from silicon base solar cell module," 38th IEEE Photovoltaic Specialists Conference, pp. 002355-002358 (2012).
Ward, et al., "The Spectrum of Electromagnetic Radiation," retrieved from http://ozonedepletiontheory.info/ImagePages/electromagnetic-spectrum.html, 1 page (2015).
Wikipedia, "Ethylene-vinyl acetate," retrieved from https://en.wikipedia.org/wiki/Ethylene-vinyl_acetate, 4 pages (2021).
Wikipedia, "X-ray," retrieved from https://en.wikipedia.org/wiki/X-ray, 27 pages (2021).
Zhang, et al., "Study On Melting Behavior Of Polymers During Burning," Fire Safety Science 8, pp. 637-646 (2005).

* cited by examiner

SOLAR MODULE
110

SOLAR MODULE
ASSEMBLY
120

SOLAR CELL
100

METHOD AND SYSTEMS FOR RECYCLING END-OF-LIFE PHOTOVOLTAIC MODULES

CROSS-REFERENCE TO RELATED PATENT APPLICATIONS

This application is a continuation of U.S. patent application Ser. No. 17/874,044 filed Jul. 26, 2022, which is a continuation of U.S. patent application Ser. No. 17/347,171 filed Jun. 14, 2021, which claims the benefit of and priority to U.S. Provisional Patent Application No. 63/124,844 filed Dec. 13, 2020, both of which are herein incorporated by reference in their entireties.

FIELD OF INVENTION

Embodiments described herein are related to the field of recycling end-of-life solar modules.

BACKGROUND OF THE INVENTION

Photovoltaic solar modules are an increasingly popular method of generating electricity. In the US alone, installed power-generating capacity multiplied by a factor of nearly 20 from 2010 to 2019 and is only expected to increase. These modules have a useful life of about 20 to 30 years before they must be decommissioned and replaced. While the number of end-of-life cells is currently relatively low, the cells installed in the past decade will generate a huge amount of waste in the coming years.

Currently, the most prevalent technology for recycling these modules requires the burning of the encapsulant that binds the front layer and polymer back sheet to the solar cells, a process called pyrolysis. This is a lengthy process that causes the emission of combustion gases, leaves burnt debris on the solar cells that makes them difficult to recycle, and leaves burn marks on the glass which prevents the glass from being reused without an additional remelting process. Furthermore, the burning process requires specialized equipment that is not easily transportable. Solar modules therefore generally must be shipped to dedicated recycling centers and processed, and then the recovered materials must be shipped again to manufacturers.

Accordingly, a solar module recycling process that does not require pyrolysis and that could be deployed directly to decommissioning sites would be advantageous.

SUMMARY OF THE INVENTION

In some embodiments, a system for preparing a solar module assembly for recycling includes a vessel configured to control a temperature and a humidity therewithin and to receive a solar module of the solar module assembly, the solar module including a plurality of solar cells, a front layer coupled to the plurality of solar cells by a first encapsulant layer, and a back sheet coupled to the plurality of solar cells by a second encapsulant layer. The system further includes an emitter positioned within the vessel and configured to emit electromagnetic radiation toward the solar module to debond at least one of the first encapsulant layer or the second encapsulant layer and a peel block configured to separate at least one of the front layer or the back sheet from the plurality of solar cells. The system is configured to be transported in one or more standard shipping containers.

In some aspects of the system, the emitter is configured to emit X-ray radiation.

In some aspects of the system, the vessel is configured to maintain the temperature above about 50° C. and below about 374° C., and the vessel is configured to maintain the relative humidity above about 30%.

In some aspects, the system further includes one or more of a frame storage bin, a junction box storage bin, a cable storage bin, a front layer storage bin, a back sheet storage bin, or a solar cell storage bin.

In some aspects, the system further includes a control unit configured to provide power to the emitter.

In some aspects, the system further includes at least one automation device controlled by the control unit and configured to physically move at least one of: the solar module into the vessel, the solar module through the peel block, the back sheet into the back sheet storage bin, the front layer into the front layer storage bin, or the solar cells into the solar cell storage bin.

In some aspects of the system, the at least one automation device comprises a conveyor, a roller, a robotic arm, or an actuator.

In some aspects, the system is configured to be transported in one or more standard shipping containers.

In some aspects, the system is configured to be operated within the one or more standard shipping containers.

In some aspects of the system, each component of the system is sized to fit inside a standard shipping container.

In some aspects of the system, the peel block includes a tapered front edge comprising openings configured to emit humidified air.

In some aspects of the system, the humidified air is at a temperature of above about 50° C. and below about 374° C. and a relative humidity above about 30%.

In some embodiments, a system for disassembling a crystalline silicon solar module includes an emitter and a first automation device configured to position a crystalline silicon solar module of the crystalline silicon solar module assembly under the emitter. The crystalline silicon solar module includes a plurality of crystalline silicon solar cells, a front layer coupled to the plurality of crystalline silicon solar cells by a first encapsulant layer, and a back sheet coupled to the plurality of crystalline silicon solar cells by a second encapsulant layer. The emitter is configured to apply X-ray radiation to the crystalline silicon solar module to debond at least one of the first encapsulant layer or the second encapsulant layer. The system further includes a peel block configured to separate at least one of the front layer or the back sheet from the plurality of crystalline silicon solar cells, a second automation device configured to move the crystalline silicon solar module away from the emitter and to the peel block, and a controller configured to control and supply power to the automation devices.

In some aspects, the system further includes a plurality of storage bins each configured to receive one of the front layer, the back sheet, or the crystalline silicon solar cells, and a third automation device configured to move at least one of the of the front layer, the back sheet, or the crystalline silicon solar cells into a respective storage bin.

In some aspects of the system, each automation device comprises a conveyor, a roller, a robotic arm, or an actuator.

In some aspects, the system is fully automated such that the crystalline silicon solar module can be disassembled without human interaction.

In some aspects of the system, the peel block comprises a tapered front edge configured to emit humidified air.

In some embodiments, a method of decommissioning a solar module installation comprising a plurality of solar modules includes arranging components of a solar module disassembly system in one or more shipping containers. The components include an emitter configured to emit X-ray radiation, a peel block configured to separate layers of a solar module, one or more automation devices configured to handle the solar module, and a controller configured to supply power to and control the components. The method further includes transporting the components to the solar module installation, applying X-ray radiation via the emitter to debond at least one of a first encapsulant layer or a second encapsulant layer of a first solar module, and separating, using the peel block, at least one of a front layer or a back sheet from a plurality of solar cells of the first solar module.

In some aspects, the method further includes electrically coupling the controller to the plurality of solar modules to supply power to the controller, the plurality of solar modules including the first solar module, and electrically decoupling the first solar module from the plurality of solar modules.

In some aspects of the method, the applying and separating steps occur within a first shipping container.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1B:
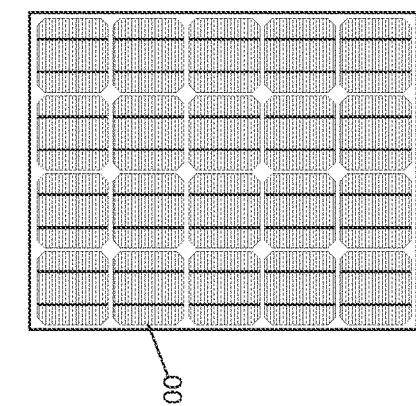
FIGS. 1A, 1B, and 1C illustrate examples of a solar cell, a solar module, and a solar module assembly, respectively.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Described herein are systems and methods for efficiently recycling photovoltaic solar module assemblies with minimal damage to the valuable component materials. EMR with wavelengths less than about 100 nm can be applied to the solar modules under controlled temperature and humidity conditions to break down the encapsulant layers. In some embodiments, a method is provided for applying the radiation and then separating the front layer and back sheet from the solar cells to recycle the component parts. In some embodiments, a system is provided for performing the recycling methods in one or more portable shipping containers.

Figure 1C:
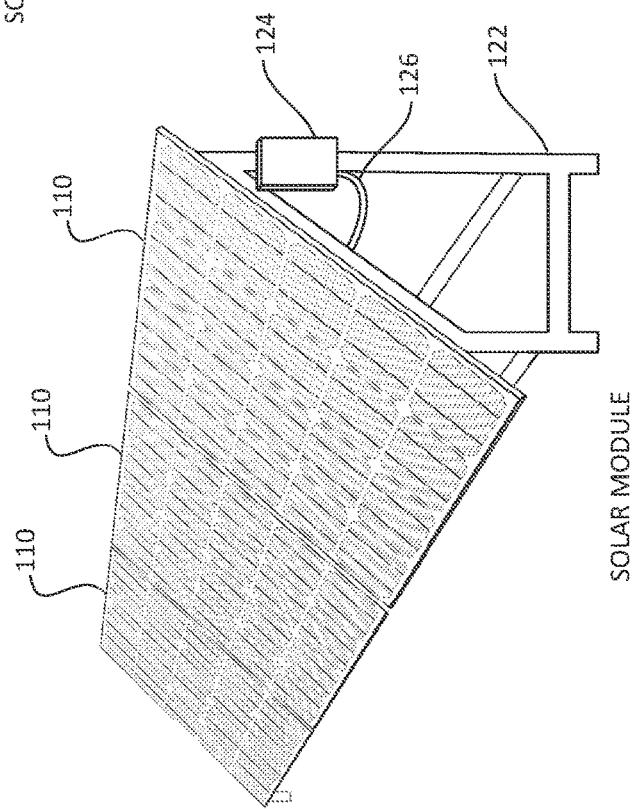
Figure 1A:
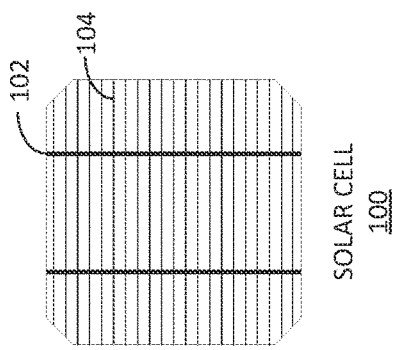

FIG. 1A depicts a solar cell 100. A solar cell 100, also known as a photovoltaic cell, is an electrical device that converts the energy of light directly into electricity using the photovoltaic effect. Solar cells 100 are most commonly made from a thin, square wafer of crystalline silicon (C—Si). Sizes vary, but an individual cell is commonly about 6 to 8 inches square and about 5 to 500 micrometers thick. Thin strips of metal, most often silver, may be printed onto the wafer, with relatively thicker strips called busbars 102 running in one direction and relatively thinner strips called fingers 104 running perpendicular to the busbars 102. The busbars 102 and fingers 104 can collect the electricity generated by the wafers.

FIG. 1B depicts a solar module 110. A solar module 110 is an assembly of solar cells 100 mounted in a panel for installation in a solar module assembly 120. Solar cells 100 may be arranged into a thin, grid-like solar cell sheet 114, most commonly in a rectangle shape with 6 columns and 10 to 12 rows of cells. The cells may be encased in a front layer 112, which is outward facing and light-transmissive layer, such as but not limited to glass, and a back sheet 116. There may be a first encapsulant layer 118a between the front layer 112 and the solar cells 100 and a second encapsulant layer 118b between the back sheet 116 and the solar cells 100, which adhere the layers together. In some embodiments, the encapsulant layers 118 may consist of a single adherent material, in another embodiment, the encapsulant layers 118 may comprise more than one material, such as bi-layers or multi-layers, or alternatively may comprise heterogeneous layers, such as where the first encapsulant layer 118a and the second encapsulant layer 188b differ. The encapsulant material may be, but is not limited to, ethyl vinyl acetate (EVA) or polyolefin elastomer (POE).

FIG. 1C depicts a solar module assembly 120. A solar module assembly 120 is the final installed product used to produce electricity from the solar cells 100. A solar module assembly 120 may include a frame 122 used to support one or more solar modules 110, keeping them off the ground or mounted to a roof, and optionally angled to increase light exposure from the sun or other light sources. The frame 122 may be made of a recyclable metal such as, but not limited to, aluminum. A solar module assembly 120 also may include a junction box 124 and one or more module power cables 126 needed to transmit the electricity from the solar modules 110 to the electrical grid or to electrical devices connected to the assembly.

Because of the rapidly expanding use of solar modules, recovering and recycling the valuable materials is becoming increasingly important. The materials that can potentially be recovered include: the metals from the frame 122, the glass from the front layer 112, the silicon from the solar cells 100, metals including silver and copper from the busbars 102 and fingers 104, the junction boxes 124, the module power cables 126, and polymer from the back sheet 116. In order to recycle the materials in the solar module 110, the solar cells 114, front layer 112, and back sheet 116 must be decoupled from the encapsulant layers 118. Pyrolysis may be used to burn the encapsulant away. However, this process leaves debris and residue on the front layer 112 and the solar cells 114 that make it difficult to recycle the silicon from the solar cells 100 and metals from the busbars 102 and fingers 104, and make it impossible to reuse the front layer 112 without crushing and remelting the glass.

One implementation of the present disclosure relates to a process of rapidly debonding the encapsulant layers 118 of the solar module 110. Under normal operating conditions, encapsulant in a solar module 110 breaks down over years or decades due to exposure to UV light from the sun. The UV light causes microscopic cracks to form in the EVA polymer in a process called crazing causing the encapsulant to break down and debond from the other layers. Exposure to higher energy EMR accelerates this process and breaks down the polymer faster than the polymer would naturally degrade in an exposed environment, such as due to sun exposure. It is well known that, according to Planck's Theory, the energy of EMR is inversely proportional to its wavelength. In this implementation, the debonding process may be greatly accelerated using targeted EMR with wavelengths less than about 100 nm. Furthermore, experimental data has shown that exposure to high temperature and relative humidity dramatically increases the debonding rate and reduces the adhesion of the encapsulant layers 118. In this implementation, the EMR is applied in a high temperature and high relative humidity environment 212, further accelerating the debonding process. Under these conditions, encapsulant layers 118 can be reduced to non-adhesive flakes or dust in a matter of minutes or seconds.

In some embodiments, the solar module 110 may be placed in an environment 212 in which the relative humidity is at least about 30% and the temperature is above about 50° C. and below about 374° C. while EMR is applied. The environment 212 may be contained in a closed vessel 330 in which the temperature and humidity are maintained and the EMR is emitted so that users are not exposed to the EMR. The EMR may cause the encapsulant to debond from the front layer 112, solar cells 114, and back sheet 116 much faster than under natural conditions. The temperature of the environment 212 can be increased, for example, using a heater and the humidity can be increased, for example, using a water boiler to produce water vapor. A water boiler may also be used to increase both humidity and temperature.

Figure 2:
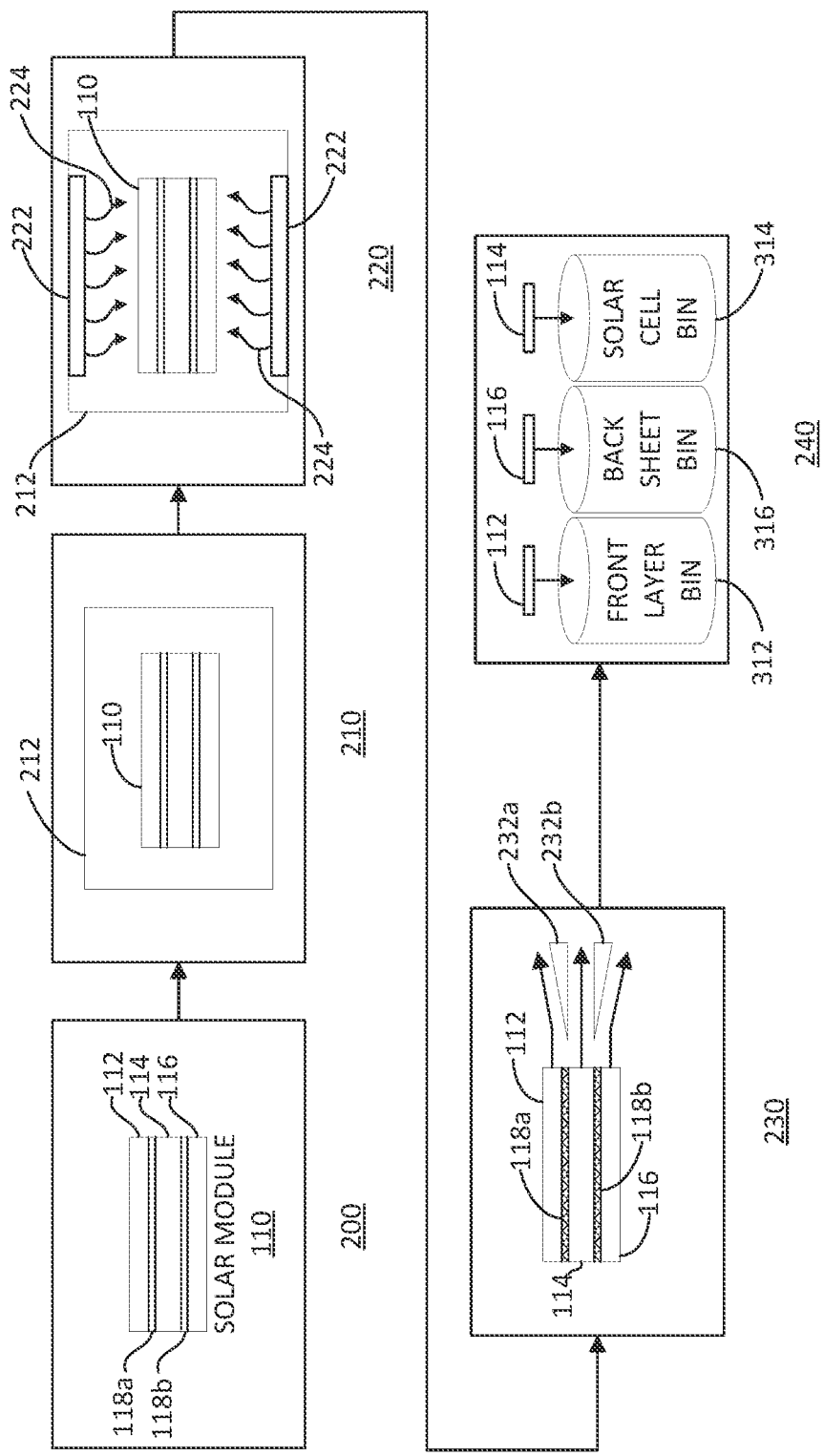
FIG. 2 illustrates one implementation of a method of preparing a solar module for recycling.

Another implementation, shown in FIG. 2, relates to a method of recycling a solar module 110 using targeted EMR to break down the encapsulant layers 118 so that the front layer 112 and back sheet 116 can be separated. A solar module 110 may be provided at providing step 200. The solar module 110 may be placed in a temperature-controlled and humidity-controlled environment 212 at placing step 210. For example, the environment may be held at a relative humidity above about 30% and a temperature above about 50° C. and below about 374° C. In some embodiments, this environment 212 may be an enclosed chamber and may include shielding, such as lead shielding, to protect users from the EMR. The solar module may be held in place by one or more vacuum chucks or may rest on a surface that allows most of the front and back sides of the module to be exposed, such as a grate. The module may also be placed on an EMR-transmissive surface, such as glass, such that EMR passes through the surface and reaches the encapsulant. While inside the controlled environment 212, EMR 224 may be applied from both sides of the solar module 110 by one or more emitters 222 at applying step 220. In other embodiments, EMR 224 may be applied from one side of the solar module 110 at a time, turning the module over in between. In other embodiments, EMR 224 may be applied only from one side and may require extra time to break down the encapsulant layer farther from the emitter 222. In some embodiments, the controlled environment 212 may be configured to be movable, such that the environment 212 can be brought to a stationary solar module 110 rather than placing the solar module 110 in the environment 212.

In some embodiments, the emitter 222 may be in a rod shape, emitting EMR 224 along a longitudinal edge. The emitter 222 may be fixed in position while the solar module 110 moves underneath it, allowing all of the solar module 110 to be exposed to the EMR 224. Alternatively, the emitter 222 may be configured to be movable, such that it passes over all of the solar module 110. In other embodiments, the emitter 222 and the solar module 110 may both remain stationary during the applying step 220.

After the EMR 224 has been applied and the encapsulant layers 118 have debonded from the other module components, the solar modules 110 may be fed into one or more peel blocks 232, shown at separating step 230. The peel blocks 232 may be tapered to a sharp front edge such that the first peel block 232a can be forced between the front layer 112 and the solar cell sheet 114, and the second peel block 232b can be forced between the back sheet 116 and the solar cell sheet 114 in order to separate the layers. In various embodiments, the separating step 230 may be carried out inside or outside the temperature and humidity controlled environment 212. In some embodiments, the peel blocks 232 may emit hot humidified air with air from openings near their front edges. The humidified air emitted from the peel blocks 232 may be at a controlled temperature above about 50° C. and below about 374° C. and a controlled relative humidity above about 30%. When the separating step 230 is performed inside the temperature and humidity controlled environment 212, the humidified air emitted from the peel blocks 232 may help control the temperature and humidity inside the environment. The humidified air emitted may be at a sufficient pressure to blow away the remaining flakes or dust from the encapsulant layers 118 and further facilitate the separation of the layers.

The peel blocks 232 may be made out of a metal, such as, but not limited to steel. The tapered edge of the peel blocks 232 may be "sharp" enough to fit between the front layer 112 and the solar cell sheet 114, and between the back sheet 116 and the solar cell sheet 114. In embodiments that include a high-pressure humidified air stream emitted by the peel blocks 232, the pressure may create additional separation between the solar cell sheet 114 and the front layer 112 and back sheet 116 before the front edge makes contact with the module. A heater may be used to heat water from a tank or other water source to humidify the air stream emitted from the peel blocks 232. The heater and/or the water source may be integrated into the peel blocks 232 themselves. Alternatively, the heater may heat water to create the humidified air which is delivered to the peel blocks 232 by a fluidic channel, such as a hose or pipe.

In some embodiments, multiple peel blocks 232 may operate simultaneously, separating the solar cell sheet 114 from the back sheet 116 and the front layer 112 in one step. In other embodiments, the front layer 112 may be separated from the solar cell sheet 114 in one step and the back sheet 116 separated from the solar cell sheet 114 in a separate step. If the steps are not performed simultaneously, one peel block 232 may be used to perform both steps by feeding the solar module 110 through the peel block 232 once, turning the remaining layers of the solar module 110 over, and feeding the remaining layers through a second time. The peel blocks 232 may be arranged so as to not contact the solar cell sheet 114 or to make only incidental contact with the solar cell sheet 114. In either case, the solar cell sheet 114 is not damaged by the action of the peel blocks 232 and may remain intact for reuse or recycling.

In some embodiments, the solar module 110 may be fed into the peel blocks 232 by a conveyor or roller system. Alternatively, the solar module 110 may be moved by one or more robotic arms. The robotic arms may use suction to hold the solar module 110 by the front layer 112 or the back sheet 116. As the solar module 110 passes through the peel blocks 232, one or more clamps may clamp onto one or more of the back sheet 116, solar cell sheet 114, or front layer 112 to pull the remainder of the solar module 110 through the peel blocks 232. A clamp may be used to hold the solar cell sheet 114 in place while the front layer 112 and back sheet 116 are removed.

In some embodiments, the method may be repeated for multiple solar modules 110. After the front layer 112 and back sheet 116 are separated from the solar cell sheet 114, the respective layers may be sorted into separate containers or bins (e.g. front layer storage bin 312, solar cell storage bin 314, and back sheet storage bin 316) for reuse or recycling, shown at sorting and collecting step 240. The front layer 112 may be removed without damage and may therefore be reused without crushing and remelting. The back sheet 116 contains polymer materials that may be recovered and recycled. The solar cell sheet 114 contains silicon and valuable metals which can be manually or automatically separated, recovered, and recycled or reused. The valuable materials contained in the solar modules may be sorted and collected at sorting and collecting step 240. Because pyrolysis is not used to burn away the encapsulant, the solar cell sheet 114, front layer 112, and back sheet 116 remain substantially intact and without damage from the burning or discoloration from the burnt encapsulant. This allows for a much higher recovery rate with less processing time than recycling methods that rely on pyrolysis.

In some embodiments, the process of separating the materials for recycling may be fully or partially automated. For example, the solar modules 110 may be placed into the temperature and humidity controlled environment 212 where the EMR 224 is applied, and may then be automatically carried to the peel blocks 232 by actuators, conveyors, or robotic arms. Alternatively, the solar modules 110 may be placed onto a conveyor that carries the solar modules 110 into the temperature and humidity-controlled environment 212 where the EMR 224 is applied, and then the solar modules 110 may automatically be carried into the peel blocks 232 by the same or a different conveyor. The separated layers may then be automatically sorted into separate bins for reuse or recycling using individual conveyors, chutes, or other mechanisms. In some alternative embodiments, the solar modules 110 may be manually moved into place for each step and the separated layers may be manually sorted for reuse or recycling.

In some embodiments, a method is provided for preparing full solar module assemblies 120, each containing a plurality of solar modules 110 for reuse or recycling. One or more junction boxes 124 and one or more module cables 126 may be removed and set aside for reuse or recycling. The solar modules 110 can be removed from their frames 122, and the frames 122 can be set aside for reuse or recycling. A bin may be provided for each component group for convenient sorting and transport at the conclusion of the process. The modules may then be treated with EMR 224 at controlled temperature and humidity and fed through peel blocks 232 as described above and the component materials are set aside for reuse or recycling.

Figure 3:
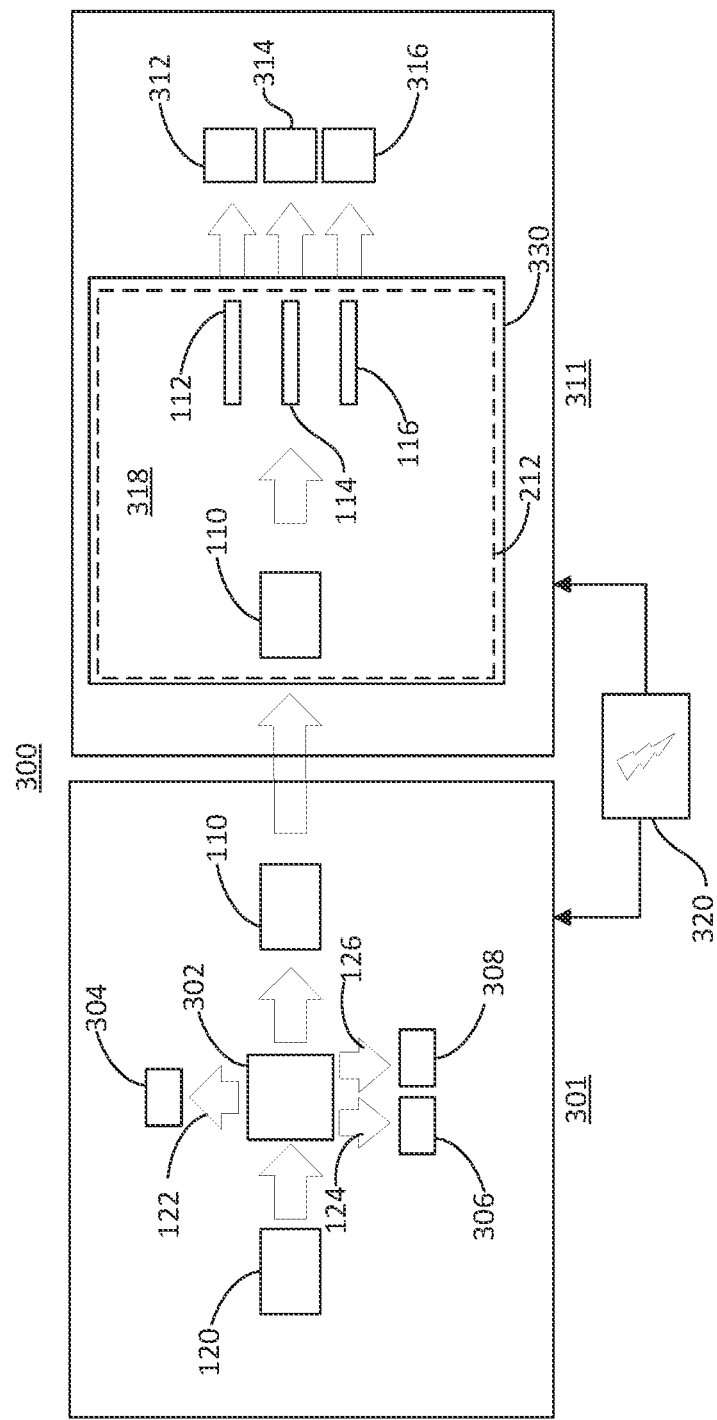
FIG. 3 illustrates one implementation of a system for preparing a solar module assembly for recycling

Another implementation of the present disclosure relates to a system for portable recycling of solar module assemblies 120. Due to the large kilns required, recycling systems that use pyrolysis to remove the encapsulant cannot easily be moved. The current implementation instead uses EMR under controlled temperature and humidity to debond the encapsulant from the other layers of the module. The equipment needed to produce these conditions is smaller than kilns needed for pyrolysis and can more easily be moved. In some embodiments of the present disclosure, the necessary equipment may be arranged in one or more shipping containers. The containers may be delivered directly to a site where the solar module assemblies 120 are being decommissioned, or to any location where it would be advantageous to deconstruct the assemblies. This will save energy and logistical costs in the transportation and delivery of solar module assembly 120 components to recycling centers FIG. 3 shows an embodiment of a system 300 for portable recycling of solar module assemblies 120. The system 300 may contain assembly disassembly unit 301 and module disassembly unit 311. Each unit may be contained in one or more shipping containers. For example, assembly disassembly unit 301 may be contained in one shipping container, and module disassembly unit 311 may be contained in a second shipping container. Alternatively, both the assembly disassembly unit 301 and the module disassembly unit 311 may be contained in a single shipping container. Individual components of the system 300 may remain in the shipping containers during use or may be moved outside of the containers after delivery of the system 300 to a decommissioning site. Solar module assemblies 120 are disassembled at solar module assembly disassembly unit 302. The solar module assembly frames 122 are disassembled and the solar modules 110 are removed. Pieces of the frame 122 are stored in a frame storage bin 304 for reuse or recycling. Junction boxes 124 are removed from the solar module assembly 120 and stored in the junction box storage bin 306 for reuse or recycling. Module cables 126 are removed from the solar module assembly 120 and stored in a cable storage bin 308. The solar modules 110 may then be moved to module disassembly unit 311.

The same or a separate shipping container may contain the equipment necessary to separate the layers of the solar modules 110 in the module disassembly unit 311. The equipment may include a vessel 330 configured to create a temperature and humidity controlled environment 212 and which contains one or more EMR emitters 222, one or more peel blocks 232 to separate the layers, and a conveyor, roller, robotic arm, or actuator system to move the modules to the various stages. The system 300 includes a front layer storage bin 312, a solar cell storage bin 314, and a back sheet storage bin 316. Moving of the components in the system 300 and placement of the components into various bins may be accomplished either by hand by an operator of the system 300 or by automated or semi-automated means. After the components have been sorted into their respective bins, the bins can be delivered to various processing and recycling facilities for the recovery of valuable materials.

A control unit 320 may be provided to supply power and control the components of the system 300. The control unit 320 may be provided within one of the assembly disassembly unit 301 or the module disassembly unit 311 or outside of both. The control unit 320 may draw power from the electrical grid, a generator, or by the active solar modules remaining at the decommissioning site. The control unit 320 may include an energy storage system, such as a battery, to allow operation when power is not available. The control unit 320 may include a memory capable of storing commands and other data. The control unit 320 may include a processor capable of executing commands and receiving data from the components of the system. The control unit 320 may include a user interface to display system data, as well as one or more input devices that allow commands to be input by an operator.

The control unit 320 may send commands to the automated components of the system 300, such as actuators and conveyors. An operator may provide inputs to the control unit 320 to move the solar module assembly 120 components through the system 300. Alternatively, the control unit 320 may execute all the commands necessary to deconstruct the solar module assembly 120 without input from an operator at each step. For example, an operator could place a solar module assembly 120 into position, input a command to the control unit 320 and the control unit 320 would execute all commands necessary to automate the deconstruction of the assembly. Alternatively, certain steps of the process could be executed without input from an operator while other steps would not require an input. The control unit 320 may allow operators to control the disassembly steps without having close contact with moving parts or EMR emitters 222, which increases the safety of the system 300.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the disclosure have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed:

1. A method of decommissioning a solar module installation comprising a plurality of solar modules, the method comprising:
    selecting a first solar module of the plurality of solar modules, the first solar module comprising a plurality of solar cells, a front layer, a back sheet, a first layer of encapsulant between the front layer and the plurality of solar cells, and a second layer of encapsulant between the back sheet and the plurality of solar cells;
    applying X-ray radiation to the first solar module to debond at least one of the first layer of encapsulant or the second layer of encapsulant; and
    separating at least one of the front layer or the back sheet from the plurality of solar cells.

2. The method of claim 1, further comprising maintaining the first solar module in an environment above about 50° C. and below about 374° C. and with a relative humidity above about 30% when applying the X-ray radiation.

3. The method of claim 1, further comprising supplying power from remaining solar modules in the plurality of solar modules to an X-ray emitter configured to apply the X-ray radiation.

4. The method of claim 1, wherein separating the front layer from the plurality of solar cells comprises inserting a tapered edge between the front layer and the plurality of solar cells.

5. The method of claim 4, further comprising supplying humidified air to a peel block comprising the tapered edge causing the humidified air to be emitted from openings on the tapered edge.

6. The method of claim 4, further comprising supplying water to a peel block comprising the tapered edge and heating the water in the peel block to vaporize the water and cause the vaporized water to be emitted from openings on the tapered edge.

7. The method of claim 4, wherein the tapered edge does not contact the plurality of solar cells when the tapered edge is inserted between the front layer and the plurality of solar cells.

8. The method of claim 1, wherein the first layer of encapsulant and the second layer of encapsulant are made of ethyl vinyl acetate.

9. The method of claim 1, wherein the first layer of encapsulant and the second layer of encapsulant are made of polyolefin elastomer.

10. The method of claim 1, wherein the front layer is separated from the plurality of solar cells without burning the first layer of encapsulant, or the back sheet is separated from the plurality of solar cells without burning the second layer of encapsulant.

11. The method of claim 1, wherein the X-ray radiation is applied to both sides of the first solar module to debond the first layer of encapsulant and the second layer of encapsulant simultaneously.

12. The method of claim 1, wherein the front layer and the back sheet are removed from the plurality of solar cells simultaneously.

13. The method of claim 1, wherein the front layer is made of glass, the back sheet comprises polymeric material, the plurality of solar cells comprise crystalline silicon, and the first layer of encapsulant and the second layer of encapsulant are made of ethyl vinyl acetate or polyolefin elastomer.

14. A method of decommissioning a solar module installation comprising a plurality of solar modules, the method comprising:
 selecting a first solar module of the plurality of solar modules, the first solar module comprising a plurality of solar cells, a front layer, a back sheet, a first layer of polyolefin elastomer encapsulant between the front layer and the plurality of solar cells, and a second layer of polyolefin elastomer encapsulant between the back sheet and the plurality of solar cells;
 applying X-ray radiation to the first solar module to debond at least one of the first layer of polyolefin elastomer encapsulant or the second layer of polyolefin elastomer encapsulant; and
 separating the front layer or the back sheet from the plurality of solar cells by inserting a tapered edge between the plurality of solar cells and the front layer or the back sheet.

15. The method of claim 14, further comprising ejecting humidified air from the tapered edge while separating the front layer or the back sheet from the plurality of solar cells.

* * * * *